(12) United States Patent
Takahashi

(10) Patent No.: US 11,227,983 B2
(45) Date of Patent: Jan. 18, 2022

(54) LIGHT EMITTING DEVICE AND METHOD OF MANUFACTURING THE LIGHT EMITTING DEVICE

(71) Applicant: NICHIA CORPORATION, Anan (JP)

(72) Inventor: Tsuzuki Takahashi, Kaifu-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/509,876

(22) Filed: Jul. 12, 2019

(65) Prior Publication Data

US 2019/0334068 A1 Oct. 31, 2019

Related U.S. Application Data

(62) Division of application No. 15/637,984, filed on Jun. 29, 2017, now Pat. No. 10,396,261.

(30) Foreign Application Priority Data

Jun. 30, 2016 (JP) .................................. 2016-130199
Jan. 20, 2017 (JP) .................................. 2017-008468

(51) Int. Cl.
*H01L 33/62* (2010.01)
*H01L 33/20* (2010.01)
(Continued)

(52) U.S. Cl.
CPC .............. *H01L 33/62* (2013.01); *H01L 21/56* (2013.01); *H01L 21/561* (2013.01); *H01L 33/20* (2013.01);
(Continued)

(58) Field of Classification Search
CPC ..... H01L 33/48; H01L 33/483; H01L 33/486; H01L 33/52; H01L 33/54; H01L 33/62;
(Continued)

(56) References Cited

U.S. PATENT DOCUMENTS 8,076,182 B2 * 12/2011 Lin .................... H01L 21/486
438/118
8,362,496 B1 * 1/2013 Tu ...................... H01L 23/3107
257/82
(Continued)

FOREIGN PATENT DOCUMENTS

CN  103515520 A  1/2014
JP  5-129742 A   5/1993
(Continued)

*Primary Examiner* — Aaron J Gray
(74) *Attorney, Agent, or Firm* — Birch, Stewart, Kolasch & Birch, LLP

(57) ABSTRACT

A method of manufacturing a light emitting device includes: providing a substantially flat plate-shaped base member which in plan view includes at least one first portion having an upper surface, and a second portion surrounding the at least one first portion and having inner lateral surfaces; mounting at least one light emitting element on the at least one first portion; shifting a relative positional relationship between the at least one first portion and the second portion in an upper-lower direction to form at least one recess defined by an upper surface of the at least one first portion that serves as a bottom surface of the at least one recess and at least portions of the inner lateral surfaces of the second portion that serve as lateral surfaces of the at least one recess; and bonding the at least one first portion and the second portion with each other.

16 Claims, 10 Drawing Sheets

(51) Int. Cl.
*H01L 33/46* (2010.01)
*H01L 21/56* (2006.01)
*H01L 33/48* (2010.01)
*H01L 33/00* (2010.01)
*H01L 23/31* (2006.01)
*H01L 23/00* (2006.01)
*H01L 33/60* (2010.01)

(52) U.S. Cl.
CPC ............ *H01L 33/46* (2013.01); *H01L 33/483* (2013.01); *H01L 23/3121* (2013.01); *H01L 24/16* (2013.01); *H01L 24/45* (2013.01); *H01L 24/48* (2013.01); *H01L 24/81* (2013.01); *H01L 24/85* (2013.01); *H01L 24/97* (2013.01); *H01L 33/0095* (2013.01); *H01L 33/60* (2013.01); *H01L 2224/16225* (2013.01); *H01L 2224/45124* (2013.01); *H01L 2224/45139* (2013.01); *H01L 2224/45144* (2013.01); *H01L 2224/45147* (2013.01); *H01L 2224/45169* (2013.01); *H01L 2224/4805* (2013.01); *H01L 2224/48091* (2013.01); *H01L 2224/48237* (2013.01); *H01L 2224/8592* (2013.01); *H01L 2924/15159* (2013.01); *H01L 2924/181* (2013.01); *H01L 2933/0033* (2013.01); *H01L 2933/0058* (2013.01)

(58) Field of Classification Search
CPC ... H01L 21/56; H01L 21/561; H01L 23/3121; H01L 24/97; H01L 2924/15159; H01L 33/20
See application file for complete search history.

(56) References Cited

U.S. PATENT DOCUMENTS

| | | | |
|---|---|---|---|
| 2002/0187570 | A1 | 12/2002 | Fukasawa et al. |
| 2011/0215366 | A1* | 9/2011 | Tsukagoshi ............. H01L 33/62 257/99 |
| 2013/0044477 | A1* | 2/2013 | Lee ........................ F21S 45/49 362/235 |
| 2013/0119553 | A1 | 5/2013 | Jeong et al. |
| 2014/0001504 | A1* | 1/2014 | Lin ........................ H01L 33/52 257/98 |

FOREIGN PATENT DOCUMENTS

| | | | |
|---|---|---|---|
| JP | 5-129742 A | * | 11/1995 |
| JP | 5-129742 A | * | 11/1995 |
| JP | 7-312470 A | | 11/1995 |
| JP | 3083557 U | | 11/2001 |
| JP | 2002-368281 A | | 12/2002 |
| JP | 2004-22606 A | | 1/2004 |
| JP | 2004-235203 A | | 8/2004 |
| JP | 2005-116579 A | | 4/2005 |
| JP | 2005-123477 A | | 5/2005 |
| JP | 2006-344771 A | | 12/2006 |
| JP | 2006-344772 A | | 12/2006 |
| JP | 2013-106033 A | | 5/2013 |
| JP | 2014-33027 A | | 2/2014 |
| JP | 2014-33027 A | * | 2/2014 |

* cited by examiner

LIGHT EMITTING DEVICE AND METHOD OF MANUFACTURING THE LIGHT EMITTING DEVICE

CROSS-REFERENCE TO RELATED PATENT APPLICATIONS

This application is a Divisional of copending application Ser. No. 15/637,984, filed on Jun. 29, 2017, which claims priority under 35 U.S.C. § 119(a) to Application No. 2016-130199 filed in Japan on Jun. 30, 2016, and Application No. 2017-008468 filed in Japan on Jan. 20, 2017, all of which are hereby expressly incorporated by reference into the present application.

BACKGROUND

The present disclosure relates to a light emitting device and a method of manufacturing the light emitting device.

Light emitting devices using light emitting elements such as LEDs can easily exhibit high light emission efficiency, and are thus used in various devices such as backlight devices for display devices or the like, or lighting devices. A method of manufacturing a light emitting device is known in which a light emitting element is mounted and then a light-reflective resin is disposed surrounding the light emitting device to miniaturize the light emitting device. For example, a method of manufacturing a light emitting diode is proposed that includes a first step of covering LED elements on a substrate with a light transmissive resin, a second step of removing a portion of the light transmissive resin at an intermediate portion between the LED elements to form a groove, a third step of filling the groove with a light-reflective resin, and a fourth step of curing the light-reflective resin and then cutting the substrate such that the light-reflective resin is disposed surrounding each of the LED elements to divide into individual light emitting diodes (see Japanese unexamined patent publication No. 2002-368281).

SUMMARY

In the method of manufacturing as described above, the light-reflective resin surrounding each of the light emitting elements is disposed after the mounting of the light emitting elements. In this manner, if a viscosity of the light-reflective resin is increased, it may take time to spread the resin over an entirety of the groove, which may lead to decrease in operation efficiency. It is an object of the present disclosure to provide a method of efficiently manufacturing a light emitting device with a structure that allows miniaturization, and to provide a light emitting device that can achieve reduction in weight.

A method of manufacturing a light emitting device includes: providing a substantially flat plate-shaped base member including at least one first portion each including an upper surface, a second portion surrounding each of the at least one first portion in a plan view and including inner lateral surfaces; mounting at least one light emitting element on each of the at least one first portion; shifting a relative positional relationship between the at least one first portion and the second portion in an upper-lower direction to form at least one recess each defined by an upper surface of each of the at least one first portion that serves as a bottom surface of each of the at least one recess and at least portions of corresponding ones of the inner lateral surfaces of the second portion that serve as lateral surfaces of each of the at least one recess; and bonding the at least one first portion and the second portion with each other.

A light emitting device includes: a base member including at least one first portion each including an upper surface, a second portion including inner lateral surfaces and having at least one thorough-hole each having a size that allows each of the at least one first portion to be fitted in the through-hole, and at least one recess each defined by the upper surface of each of the at least one first portion that serves as a bottom surface of each of the at least one recess and at least portions of corresponding ones of the inner lateral surfaces of the second portion that serve as lateral surfaces of each of the at least one the recess; and at least one light emitting element mounted on the bottom surface of each of the at least one recess.

With the method of manufacturing as described above, a light emitting device with a structure that allows miniaturization can be efficiently manufactured. Also, with the light emitting device as described above, reduction in weight of the light emitting device can be achieved.

DETAILED DESCRIPTION

Method of Manufacturing Light Emitting Device 1 According to First Embodiment

Figure 1A:
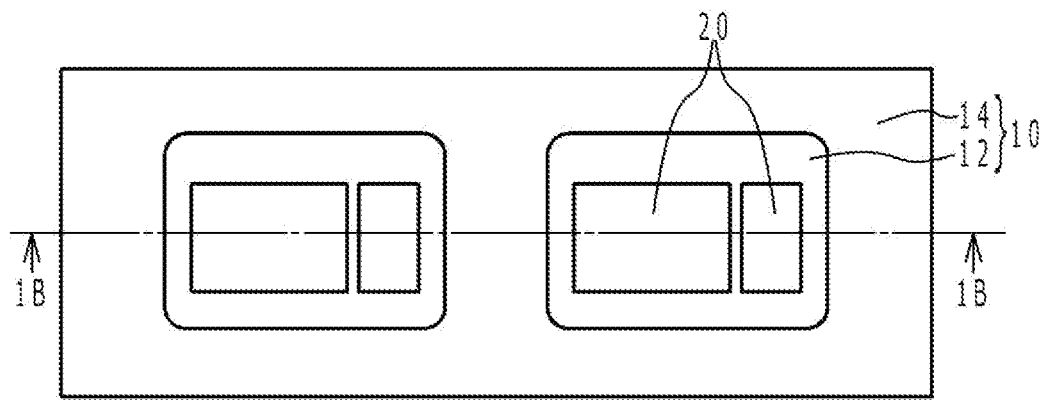
FIG. 1A is a schematic plan view illustrating a step of providing a base member in a method of manufacturing according to a first embodiment.
Figure 1B:
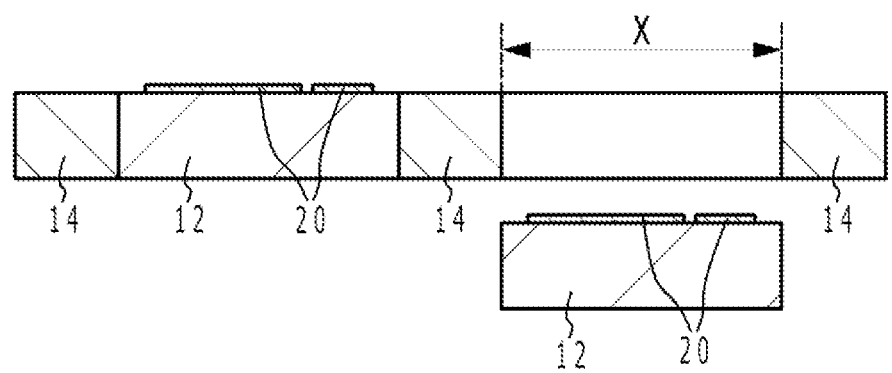
FIG. 1B is a schematic cross-sectional view taken along a line 1B-1B in FIG. 1A.
Figure 1C:
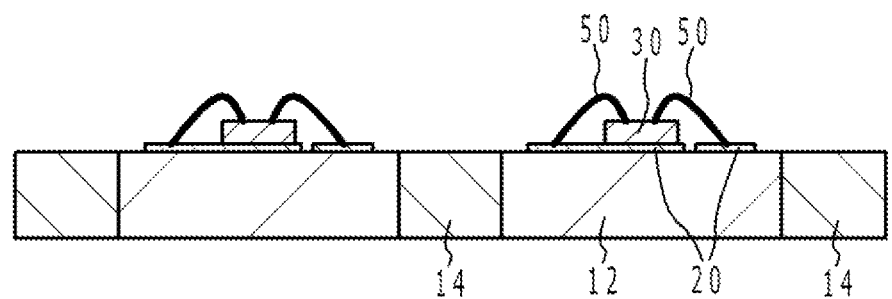
FIG. 1C is a schematic cross-sectional view illustrating a step of mounting at least one light emitting element in the method of manufacturing according to the first embodiment.
Figure 1D:
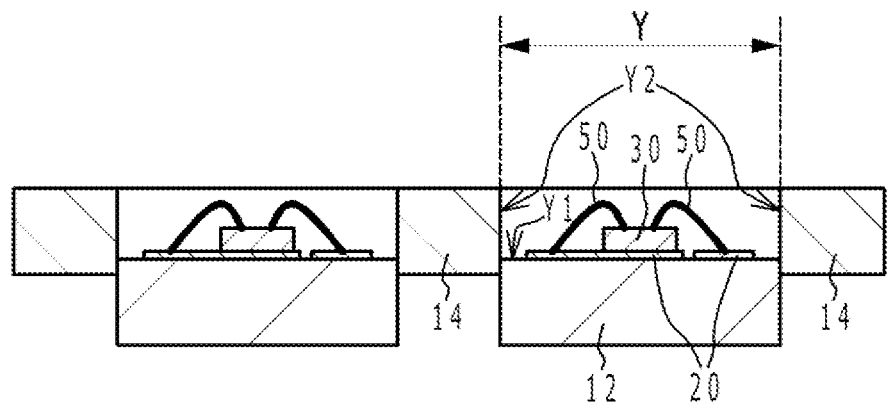
FIG. 1D is a schematic cross-sectional view illustrating a step of forming at least one recess in the method of manufacturing according to the first embodiment.
Figure 1E:
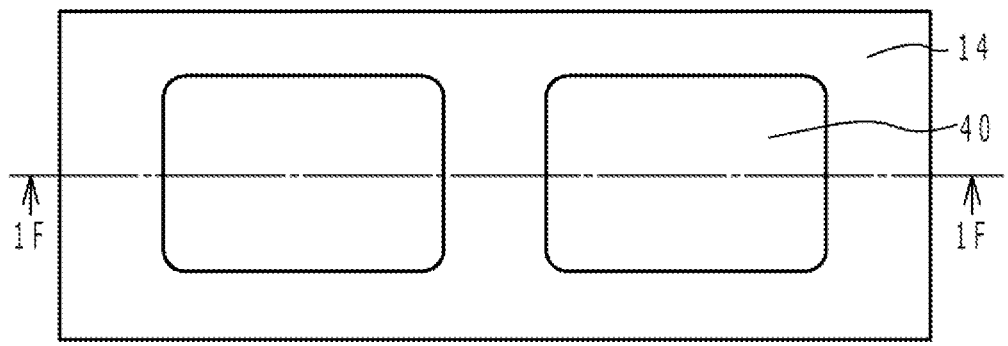
FIG. 1E is a schematic cross-sectional view illustrating a step of bonding at least one first portion and a second portion in the method of manufacturing according to the first embodiment.

FIGS. 1A to 1G are schematic diagrams illustrating a method of manufacturing a light emitting device according to a first embodiment. FIGS. 1A and 1E are schematic plan views, and FIGS. 1B to 1D, 1F, and 1D are schematic cross-sectional views. The cross-sectional views in FIGS. 1C to 1D, 1F, and 1G are viewed from the same direction as in FIG. 1B. As shown in FIG. 1A to FIG. 1G a method of manufacturing a light emitting device 1 according to the first embodiment includes providing a substantially flat plate-shaped base member 10 which in plan view includes at least one first portion 12 having an upper surface, a second portion 14 having inner lateral surfaces surrounding the at least one first portion 12, mounting at least one light emitting element 30 on the at least one first portion 12, shifting a relative positional relationship between the at least one first portion 12 and the second portion 14 in an upper-lower direction to form at least one recess Y with an upper surface of the at least one first portion defining a bottom surface Y1 of the at least one recess Y, and at least portions of the inner lateral surfaces of the second portion 14 defining lateral surfaces Y2 of the at least one recess Y, and bonding the at least one first portion 12 and the second portion 14 with each other. The respective steps will be described below.

Providing Base Member 10

As shown in FIG. 1A and FIG. 1B, the base member 10 having a substantially flat-plate shape is provided. The base member 10 includes the at least one first portion 12 and the second portion 14. The second portion 14 defines at least one through-hole X. The at least one first portion 12 is fitted with the at least one through-hole X, and in a plan view, the second portion 14 surrounds the first portion 12. In FIG. 1B, the second portion 14 has two through-holes X, and one first portion 12 is fitted in one of the two through-holes X, and the other first portion 12 is not fitted in the other one of the two through-holes X, but this illustration is for easy understanding of the through-holes X defined in the second portion 14, and in the step of providing base member 10, the other first portion 12 is also fitted in the other one of the through-holes X.

In the step of providing base member 10, the substantially plate-shaped base member 10 in which the first portion 12 and the second portion 14 have been separated and fitted together may be provided, or alternatively, the base member 10 in which the first portion 12 and the second portion 14 have not been separated from each other may be provided. In the case of providing the base member 10 including the first portion 12 and the second portion 14 that are not separated from each other, a step of separating the first portion 12 from the base member 10 to create the through-hole X and disposing the first portion 12 in the through-hole X may be performed, for example, between the present step and the step of mounting the light emitting element that will be described below, that is, after providing the base member 10 in the present step and before mounting the light emitting element. Alternatively, as described in a second and third embodiment as described below, a step of separating the first portion 12 from the base member 10 may be performed between the step of mounting the light emitting element and the step of forming the recess, that is, after mounting the light emitting element and before forming the recess. The separation of the first portion 12 from the base member 10 may be performed by any appropriate known method such as punching using a press machine, laser processing, or blade processing.

For the material of the base member 10, an insulating material can be preferably used. Examples of the material of the base member 10 include a ceramic material, resin, an insulating material, pulp, glass, and a composite material. Any appropriate resin used in this field may be used. More specific examples of the resin include an epoxy resin, a triazine derivative epoxy resin, a modified epoxy resin, a silicone resin, a modified silicone resin, an acrylate resin, and a urethane resin. Examples of the ceramic include aluminum oxide, aluminum nitride, zirconium oxide, titanium oxide, titanium nitride and mixture of one or more of these materials. Examples of the composite material include a composite resin, and a composite material of the above-described material such as a ceramic material and a metal, carbon or the like. Alternatively, a metal covered by an insulating member such as a resin may be used for the composite material. For the composite resin, a glass epoxy resin or the like may be used.

The base member 10 preferably has a high light reflectance. As described below, the light emitting element 30 is mounted on an upper surface of the first portion 12, and at least a portion of each of the inner lateral surfaces of the second portion 14 serve as lateral surfaces Y2 surrounding the light emitting element 30. With this arrangement, increase in light reflectance of the base member 10 allows for facilitating increase in light reflectance at the recess Y housing the light emitting element 30. Examples of the case where the base member 10 has a high light reflectance includes the case where the base member 10 itself is made of a material having a high light reflectance such as a ceramic material or a resin and the case where the base member 10 contains a light-reflective substance to increase light reflectance of the base member 10. Examples of the light-reflective substance include titanium oxide, silicon oxide, zirconium oxide, potassium titanate, alumina, aluminum nitride, boron nitride, mullite, and glass filler.

The base member 10 generally includes conductive pads 20 each electrically connected to the light emitting element 30, on the surface of the base member. The conductive pads 20 can be made of, for example, a metal such as copper, aluminum, gold, silver, platinum, titanium, tungsten, palladium, iron, nickel, or an alloy containing one or more of these metals. The conductive pads 20 are arranged at least on a front surface of the base member 10, and may further be arranged on a rear surface of the base member 10 via holes at the inside of the base member 10.

Mounting the Light Emitting Element 30

Next, as shown in FIG. 1C, the light emitting element 30 is mounted on the upper surface of the first portion 12. More specifically, the light emitting element 30 is mounted on one of the conductive pads 20 that is disposed on the first portion 12. The first portion 12 serves as element-mounting portion for mounting the light emitting element 30 thereon. One light emitting element 30 may be mounted on one first portion 12 as shown in FIG. 1C, but alternatively a plurality of light emitting elements 30 may be mounted on one first portion 12. In the step of mounting the light emitting element 30, the recess Y to house the light emitting element 30 has not been formed yet, and the upper surface of the first portion 12 and the upper surface of the second portion 14 are in a relative positional relationship in an upper-lower direction such that the upper surface of the first portion 12 and the upper surface of the second portion 14 are in the same plane, that is, the base member 10 has a substantially flat plate shape.

Electric connection between the light emitting element 30 and the conductive pads 20 may be established in, for example, a flip-chip manner or a wire-bonding manner. In the description below, electric connection using a wire-bonding manner is illustrated. In the case where electric connection is established in a wire-bonding manner, the step of mounting the light emitting element 30 includes connecting between the light emitting element 30 and the base member 10 via wires 50. The expression "connecting between the light emitting element 30 and the base member 10 via the wires 50" refers to electrically connecting between each of a plurality of electrodes of the light emitting element 30 and corresponding one of the conductive pads 20 on the base member 10 via the wires 50. The wires 50 are made of a material that allows electrical connection between the electrodes of the light emitting elements 30 and the conductive pads 20 on the base member 10. For the wires 50, for example, a metal such as gold, silver, copper, platinum, or aluminum, or an alloy of one or more of these may be used.

For the light emitting element 30, a semiconductor light emitting element such as a light emitting diode can be used. For the light emitting element 30, a light emitting element having an emission wavelength in any region between the ultraviolet region and the infrared region can be selected appropriately in accordance with the purpose. More specifically, a light emitting element including a growth substrate such as a sapphire substrate or a GaN substrate and a layered structure including a light emitting layer and made of various semiconductors such as nitride semiconductors (e.g., InN, AlN, GaN, InGaN, AlGaN, or InGaAlN), Group III-V compound semiconductors, or Group II-VI compound semiconductors on the growth substrate can be used for the light emitting element 30. The light emitting element 30 may include positive and negative electrodes on the same surface side thereof, or may include positive and negative electrodes on opposite surface sides thereof, respectively. In the description below, the light emitting element 30 including positive and negative electrodes on the same surface side thereof, and both of the positive and negative electrodes are bonded with the conductive pads 20, respectively, is illustrated.

Forming Recess Y

As shown in FIG. 1D, a relative positional relationship between the first portion 12 and the second portion 14 in an upper-lower direction is shifted to form the recess Y defined by the bottom surface Y1 and the lateral surfaces Y2 so that the upper surface of the first portion 12 serves as the bottom surface Y1 and at least a portion of each of the inner lateral surfaces of the second portion 14 serve as the lateral surfaces Y2. That is, the recess Y is formed after mounting the light emitting element 30. Accordingly, at least a portion of the second portion 14 serve as the lateral surfaces Y2 of the recess Y housing the light emitting element 30. The expression "shifting relative positional relationship between the first portion 12 and the second portion 14 in an upper-lower direction" refers to shifting relative positional relationship between the first portion 12 and the second portion 14 from a state where the base member 10 has a substantially flat plate shape, that is, a state where the upper surface of the first portion 12 and the upper surface of the second portion 14 are substantially in the same plane. The expression "substantially in the same plane" refers to that difference in height between the upper surface of the first portion 12 and the upper surface of the second portion 14 being in a range of ±100 μm.

Shifting relative positional relationship between the first portion 12 and the second portion 14 in the upper-lower direction may be performed by moving the first portion 12 and/or the second portion 14 in a direction perpendicular to the upper surface of the first portion 12 and upper surface of the second portion 14. That is, the relative positional relationship between the first portion 12 and the second portion 14 may be shifted by: (1) moving the second portion 14 upward to a position higher than the first portion 12 in a state where the first portion 12 is fixed, (2) moving the first portion 12 downward to a position lower than the second portion 14 in a state where the second portion 14 is fixed, or (3) moving the first portion 12 downward to a position lower than the second portion 14 and moving the second portion 14 upward to a position higher than the first portion 12. Any appropriate known method may be employed for the fixing and moving of the first portion 12 and/or the second portion 14. For example, a jig or a mold can be used for the fixing and moving.

Bonding First Portion 12 and Second Portion 14

Figure 1F:
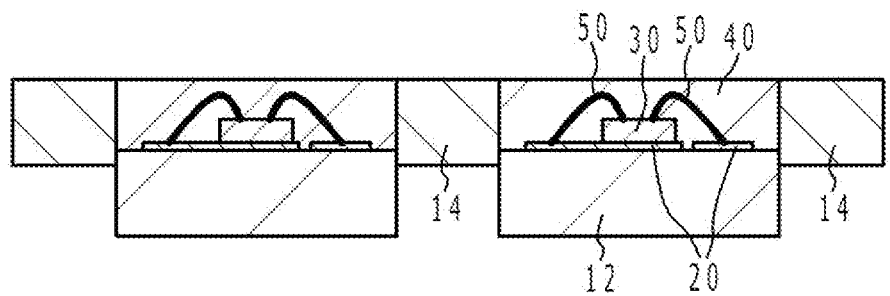
FIG. 1F is a schematic cross-sectional view taken along a line 1F-1F in FIG. 1E.

Next, as shown in FIG. 1E and FIG. 1F, the first portion 12 and the second portion 14 are bonded to each other in a state where the relative positional relationship between the first portion 12 and the second portion 14 has been shifted. More specifically, for example, the first portion 12 and the second portion 14 are bonded with each other by filling a sealing member 40 into the recess Y. That is, the sealing member 40 covers the light emitting element 30 and the wires 50 to protect the light emitting element 30 and the wires 50 from dust, moisture, external force, and the like, but in the present embodiment, the sealing member 40 also serves as a bonding member for bonding the first portion 12 and the second portion 14 with each other.

For the sealing member 40, a material that transmits light from the light emitting element 30 is preferably used. More specific examples of such a material include a resin material such as a silicone resin or an epoxy resin. In addition to these materials, a coloring agent, a filler such as a diffusion agent can be contained appropriately in the sealing member.

The sealing member 40 can include a fluorescent material that absorbs at least a part of emission from the light emitting element 30 and emits light of a different wavelength. When, for example, a blue-light emitting element or an ultraviolet-light emitting element is used for the light emitting element 30, specific examples of the fluorescent material that can be excited by such a light emitting element include a yttrium aluminum garnet-based fluorescent material activated with cerium)(YAG:Ce), a lutetium aluminum garnet-based activated with cerium (LAG:Ce), a nitrogen-containing calcium aluminosilicate fluorescent material activated with europium and/or chromium ($CaO-Al_2O_3-SiO_2$:Eu), a silicate-based fluorescent material activated with europium (($Sr,Ba)_2SiO_4$:Eu), a β-sialon-based fluorescent material, nitride-based fluorescent materials such as a CASN-based fluorescent material and a SCASN-based fluorescent material, KSF-based fluorescent material ($K_2SiF_6$:Mn), a sulfide-based fluorescent material, and a quantum dot fluorescent material. Combination of such a fluorescent material and a blue light emitting element or an ultraviolet light emitting element allows for obtaining a light emitting device of a desired emission color (e.g., white-light emitting device).

The step of bonding the first portion 12 and the second portion 14 may include filling a gap between the first portion 12 and the second portion 14 with a caulking agent or a sealing agent. For the caulking agent and the sealing agent, a resin, glass, ceramic, metal, or the like can be used. The step of bonding the first portion 12 and the second portion 14 with each other that includes filling a gap between the first portion 12 and the second portion 14 and filling the sealing member 40 into the recess Y allows the bonding strength between the first portion 12 and the second portion 14 to be further increased. Further, the possibility of leakage of the sealing member 40 from the gap between the first portion 12 and the second portion 14 can be reduced.

Cutting

Figure 1G:
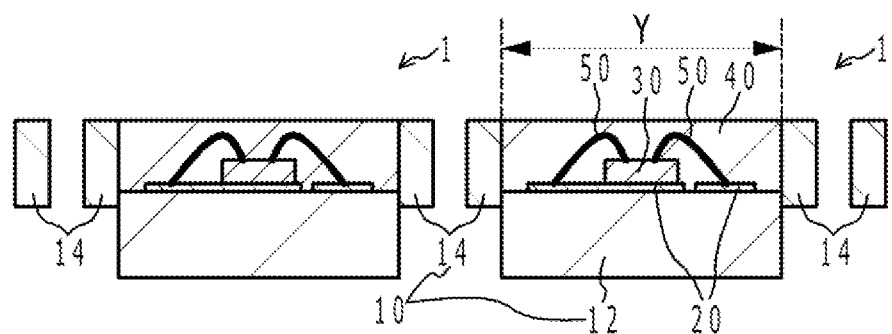
FIG. 1G is a schematic cross-sectional view illustrating a step of cutting a second portion in the method of manufacturing according to the first embodiment.

As shown in FIG. 1G, after bonding the first portion 12 and the second portion 14 with each other, the second portion 14 may be cut so that at least one of the inner lateral surfaces of the second portion remains to serve as at least one of the lateral surfaces Y2 of the recess Y. By such cutting, size of a single light emitting device 1 can be adjusted to be a desired size. Further, a single light emitting device 1 may include a desired number of light emitting parts (i.e., recess Y). For cutting, a blade or a laser beam can be used. A single light emitting device 1 may have one recess Y or a plurality of recesses Y. In the present embodiment, the light emitting device 1 has one recess Y. In the case of obtaining a single light emitting device 1 that includes a plurality of recesses Y, the step of cutting is not essential. That is, cutting may be performed to obtain individual light emitting devices each including a plurality of light emitting parts (i.e., recesses Y), or may be omitted to obtain a single light emitting device including all of a plurality of light emitting parts (i.e., recesses Y) defined by the base member 10.

As described above, in the method of manufacturing the light emitting device 1, the step of forming the recess Y housing the light emitting element 30 is performed after the step of mounting the light emitting element 30. That is, after mounting the light emitting element 30 on the plate-shaped base member 10, the lateral surfaces Y2 surrounding the light emitting element 30 are formed. With this manner, compared with the case of arranging the light emitting element 30 on the bottom surface Y1 of the recess that has been formed in the base member, distance between the light emitting element 30 and the recess Y can be shortened. That is, generally, in the case where a light emitting element is mounted on a bottom surface of a recess, mounting the light emitting element on a portion close to one or more of lateral surfaces of the recess may bring a die-bonding tool such as a die-collet used for mounting of the light emitting element into contact with the lateral surface of the recess, so that a certain amount of distance may be secured between the light emitting element and the lateral surfaces. However, with the method of manufacturing the light emitting device 1 according to the present embodiment, compared with the case of arranging a light emitting element on a bottom surface of a recess that has been formed, distance between the light emitting element 30 and the recess Y can be shortened, so that the light emitting device 1 that allows miniaturization can be efficiently manufactured.

Method of Manufacturing Light Emitting Device 2 According to Second Embodiment

Figure 2A:
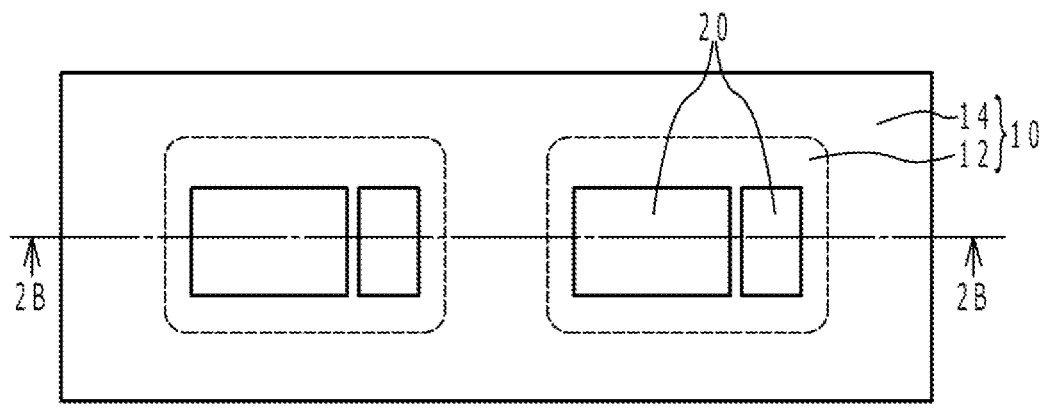
FIG. 2A is a schematic plan view illustrating a step of providing a base member in the method of manufacturing according to a second embodiment.
Figure 2B:
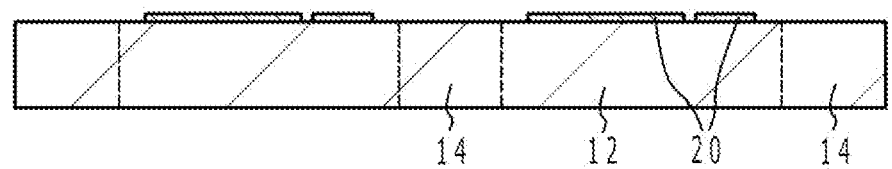
FIG. 2B is a schematic cross-sectional view taken along a line 2B-2B in FIG. 2A.
Figure 2C:
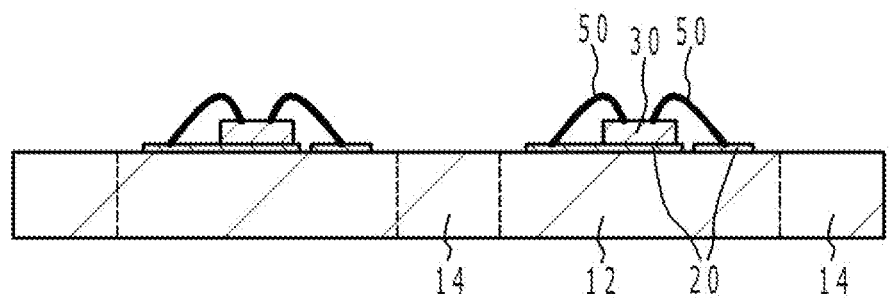
FIG. 2C is a schematic cross-sectional view illustrating a step of mounting at least one light emitting element in the method of manufacturing according to the second embodiment.
Figure 2D:
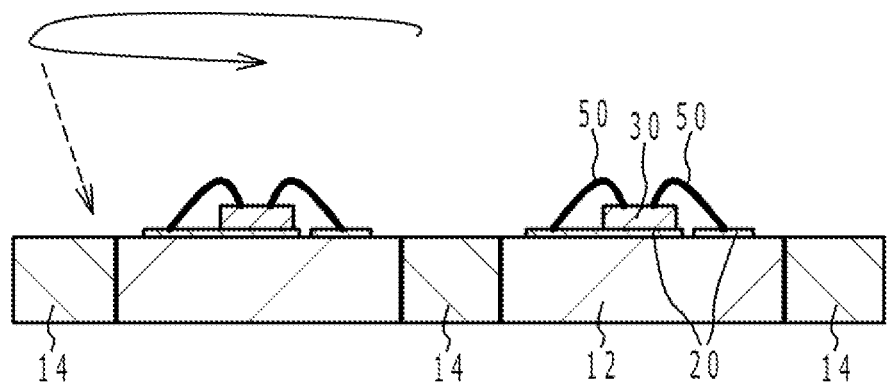
FIG. 2D is a schematic cross-sectional view illustrating a step of separating at least one first portion from a base member in the method of manufacturing according to the second embodiment.
Figure 2E:
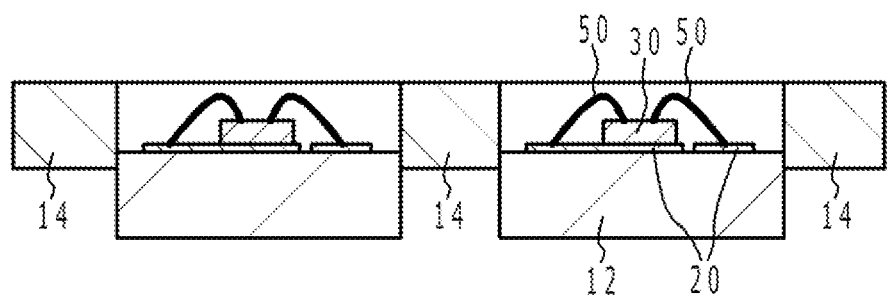
FIG. 2E is a schematic cross-sectional view illustrating a step of forming at least one recess in the method of manufacturing according to the second embodiment.
Figure 2F:
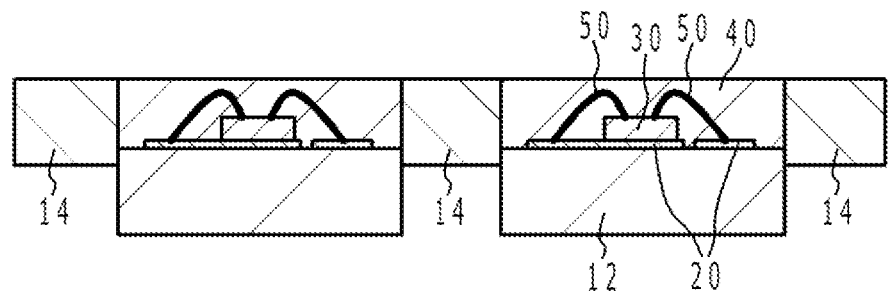
FIG. 2F is a schematic cross-sectional view illustrating a step of bonding the first portion and a second portion in the method of manufacturing according to the second embodiment.
Figure 2G:
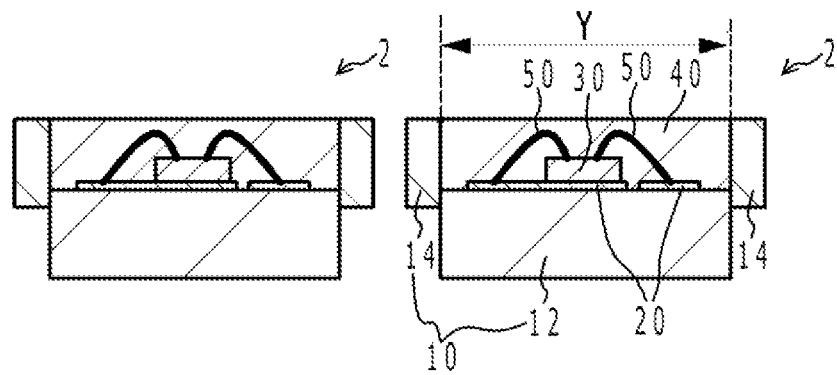
FIG. 2G is a schematic cross-sectional view illustrating a step of cutting the second portion in the method of manufacturing according to the second embodiment.

FIGS. 2A to 2G are schematic diagrams illustrating a method of manufacturing a light emitting device 2 according to a second embodiment. FIG. 2A is a schematic plan view, and FIGS. 2B to 2G are schematic cross-sectional views. The cross-sectional views in FIGS. 2C to 2G are viewed from the same direction as in FIG. 2B. The method of manufacturing the light emitting device 2 according to the second embodiment is different from the method of manufacturing the light emitting device 1 according to the first embodiment in that a step of separating a first portion 12 from a base member 10 (see FIG. 2D) is performed between the step of mounting a light emitting element 30 (see FIG. 2C) and the step of forming a recess Y (see FIG. 2E). The separating of the first portion 12 from the base member 10 can be performed by, for example, irradiating laser beam along an outer periphery of the first portion 12 to cut out the first portion 12 from the base member 10. Because laser processing has a small influence of cutting stress, laser processing is suitable for separation of the first portion 12 from the base member 10 in a state where the light emitting element 30 is mounted on the first portion 12. Other configurations are similar to those in the method of manufacturing the light emitting device 1 according to the first embodiment.

Also with the method of manufacturing the light emitting device 2 according to the second embodiment, as in the method of manufacturing the light emitting device 1 according to the first embodiment, the recess Y housing the light emitting element 30 is formed after mounting the light emitting element 30 on the plate-shaped base member 10, so that the light emitting element 30 can be mounted at a portion close to one or more of lateral surfaces Y2 of the recess Y. Accordingly, also with the method of manufacturing the light emitting device 2 according to the second embodiment, a light emitting device 2 that allows miniaturization can be efficiently manufactured.

Method of Manufacturing Light Emitting Device 3 According to Third Embodiment

Figure 3A:
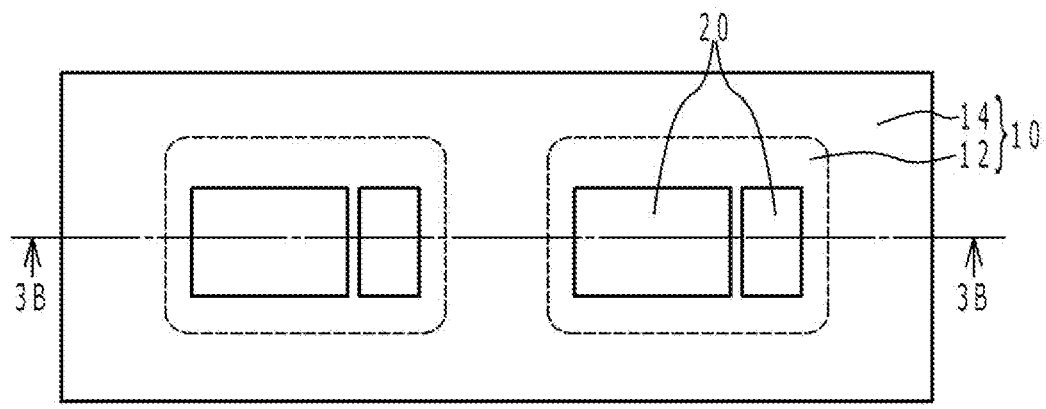
FIG. 3A is a schematic plan view illustrating a step of providing a base member in the method of manufacturing according to a third embodiment.
Figure 3B:
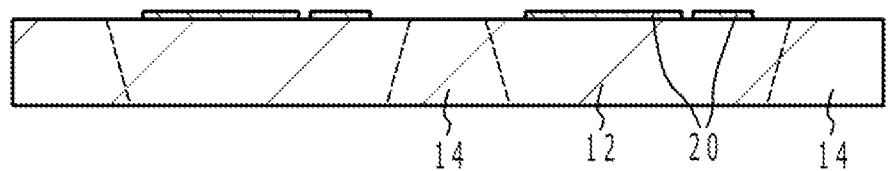
FIG. 3B is a schematic cross-sectional view taken along a line 3B-3B in FIG. 3A.
Figure 3C:
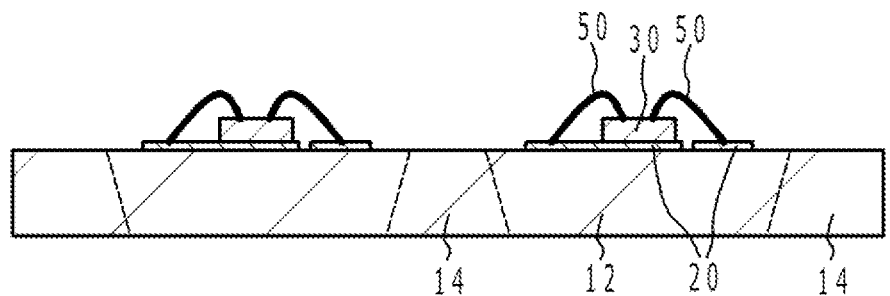
FIG. 3C is a schematic cross-sectional view illustrating a step of mounting light emitting elements in the method of manufacturing according to the third embodiment.
Figure 3D:
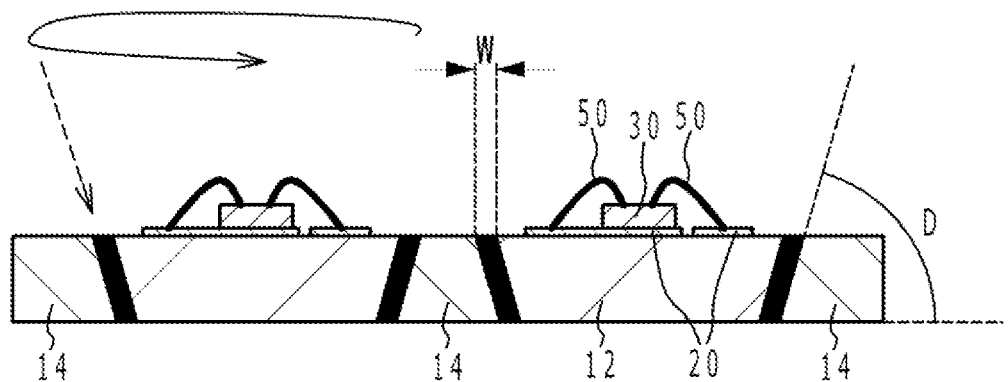
FIG. 3D is a schematic cross-sectional view illustrating a step of separating a first portion from a base member in the method of manufacturing according to the third embodiment.
Figure 3E:
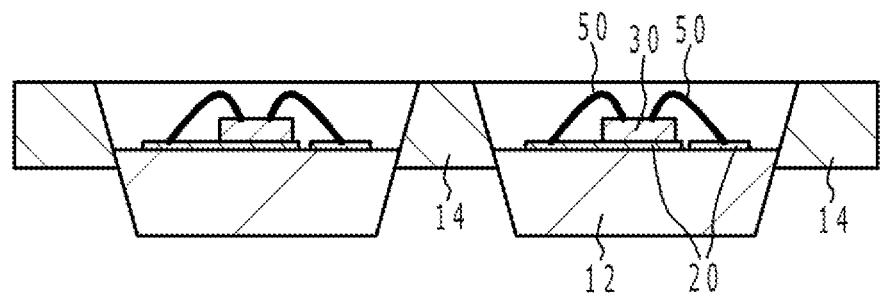
FIG. 3E is a schematic cross-sectional view illustrating a step of forming a recess in the method of manufacturing according to the third embodiment.
Figure 3F:
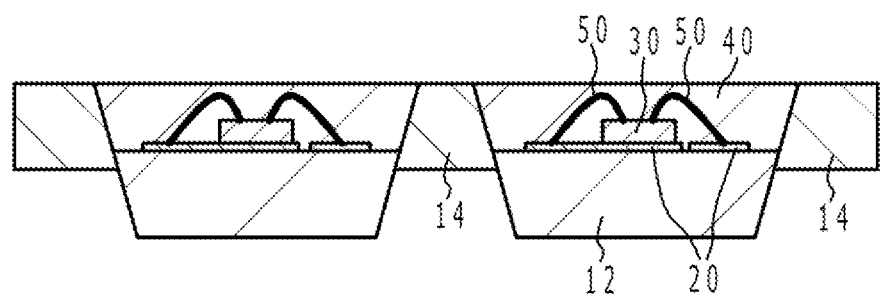
FIG. 3F is a schematic cross-sectional view illustrating a step of bonding a first portion and a second portion in the method of manufacturing according to the third embodiment.

FIGS. 3A to 3G are schematic diagrams illustrating a method of manufacturing a light emitting device 3 according to a third embodiment. FIG. 3A is a schematic plan view, and FIGS. 3B to 3G are schematic cross-sectional views. The cross-sectional views in FIGS. 3C to 3G are viewed from the same direction as in FIG. 3B. As shown in FIG. 3A to FIG. 3G, the method of manufacturing the light emitting device 3 according to the third embodiment is different from the method of manufacturing the light emitting device 2 according to the second embodiment in that lateral surfaces Y2 of a recess Y are inclined. Other configurations are similar to those in the method of manufacturing the light emitting device 2 according to the second embodiment.

Also with the method of manufacturing the light emitting device 3 according to the third embodiment, as in the method of manufacturing the light emitting device 1 according to the first embodiment, the recess Y housing a light emitting element 30 is formed after mounting of the light emitting element 30 on the plate-shaped base member 10, so that the light emitting element 30 can be mounted at a portion close to the lateral surfaces Y2 of the recess Y. Accordingly, also with the method of manufacturing the light emitting device 3 according to the third embodiment, a light emitting device 3 that allows miniaturization can be efficiently manufactured.

Further, in the method of manufacturing the light emitting device 3 according to the third embodiment, adjusting a distance W between the each of the first portion 12 and the second portion 14 and an inclination angle D between the lateral surface Y2 and a lower surface of the base member 10 allows the first portion 12 to be fitted with a through-hole X in the second portion 14 and to be held by the second portion 14, in a state where the relative positional relationship between the first portion 12 and the second portion 14 in the upper-lower direction is shifted. Accordingly, with the method of manufacturing the light emitting device 3 according to the third embodiment, the recess Y can be formed more easily in the step of forming the recess Y.

By applying pressure and/or heat to the first portion 12 and/or the second portion 14 in a state where the first portion 12 is held by the through-hole X of the second portion 14, the first portion 12 and the second portion 14 can be more firmly adhered to each other, so that the first portion and the second portion can be bonded with each other without using a sealing member 40. Bonding the first portion 12 and the second portion 14 without using the sealing member 40 allows for omitting consideration on degradation and leakage of the sealing member 40.

Method of Manufacturing Light Emitting Device 4 According to Fourth Embodiment

Figure 4A:
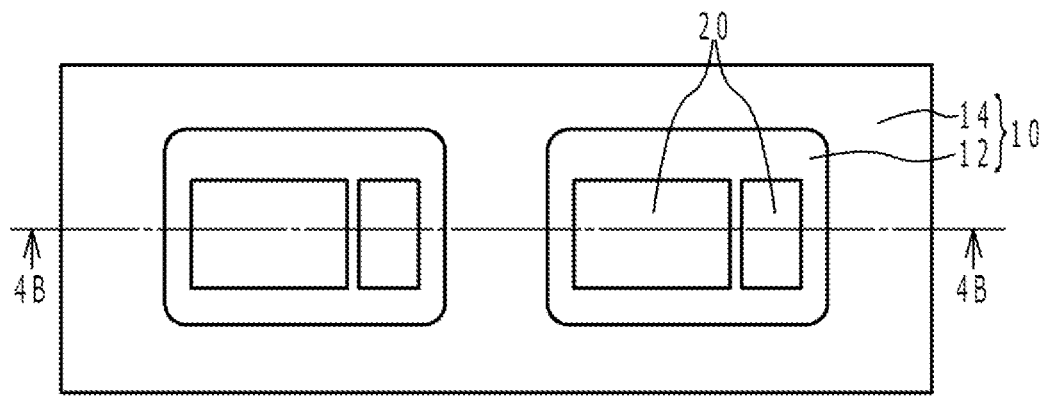
FIG. 4A is a schematic plan view illustrating a step of providing a base member in the method of manufacturing according to a fourth embodiment.
Figure 4B:
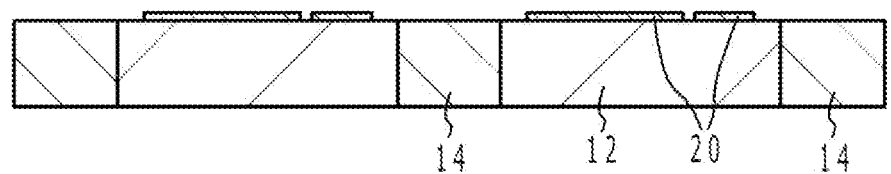
FIG. 4B is a schematic cross-sectional view taken along a line 4B-4B in FIG. 4A.
Figure 4C:
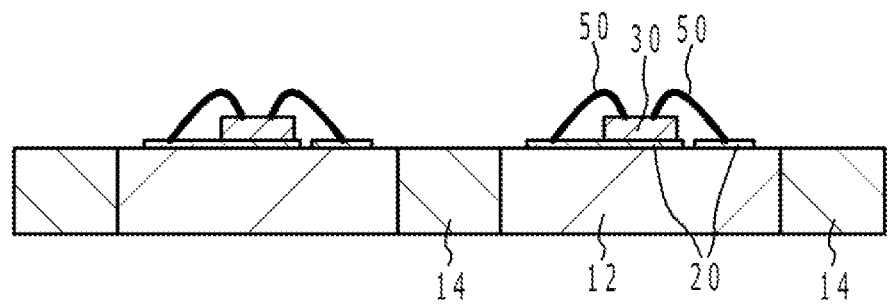
FIG. 4C is a schematic cross-sectional view illustrating a step of mounting light emitting elements in the method of manufacturing according to the fourth embodiment.
Figure 4D:
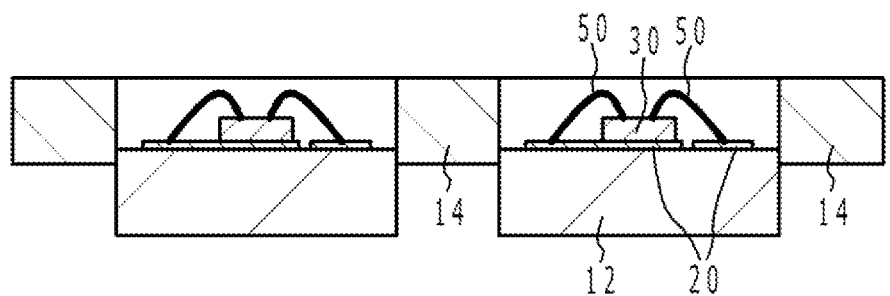
FIG. 4D is a schematic cross-sectional view illustrating a step of forming a recess in the method of manufacturing according to the fourth embodiment.
Figure 4E:
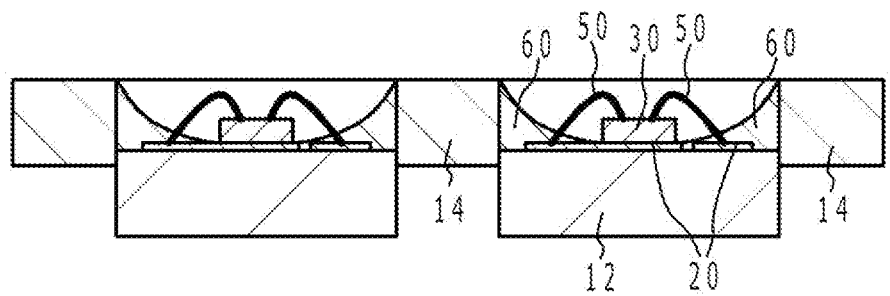
FIG. 4E is a schematic cross-sectional view illustrating disposing a light-reflective member in the recess in a step of bonding a first portion and a second portion in the method of manufacturing according to the fourth embodiment.
Figure 4F:
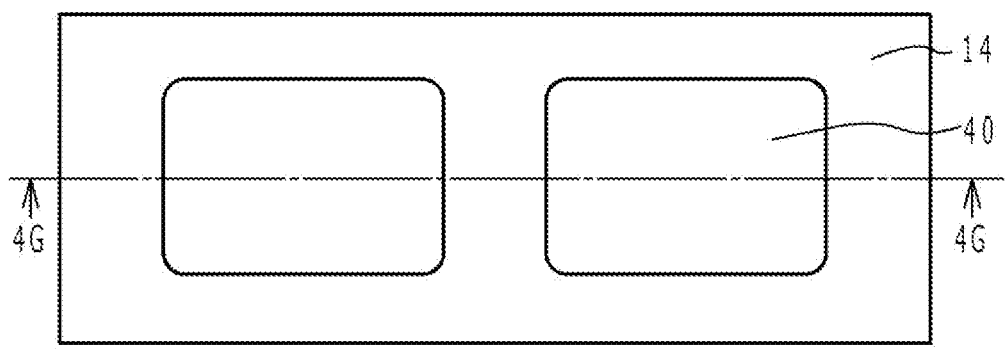
FIG. 4F is a schematic cross-sectional view illustrating a step of bonding a first portion and a second portion in the method of manufacturing according to the fourth embodiment.

FIGS. 4A to 4H are schematic diagrams illustrating a method of manufacturing a light emitting device 4 according to a fourth embodiment. FIGS. 4A and 4F are schematic plan views, and FIGS. 4B to 4D, 4E, 4G, and 4H are schematic cross-sectional views. The cross-sectional views in FIGS. 4C to 4E, 4G, and 4H are viewed from the same direction as in FIG. 4B. The method of manufacturing the light emitting device 4 according to the fourth embodiment is different from the method of manufacturing the light emitting device 1 according to the first embodiment in that, in the step of bonding a first portion 12 and the second portion 14 with each other, a light-reflective member 60 is disposed covering at least a portion of a bottom surface Y1 and at least a portion of each of lateral surfaces Y2 of a recess Y (see FIG. 4E) before charging a sealing member 40. Other configurations are similar to those in the method of manufacturing the light emitting device 1 according to the first embodiment.

In the present embodiment, an entirety of the bottom surface Y1 and the lateral surfaces Y2 of the recess Y is covered by the light-reflective member 60, but, as described above, the light-reflective member 60 may cover at least a portion of the bottom surface Y1 and at least a portion of each of the lateral surfaces Y2 of the recess Y. In the case where the entirety of the bottom surface Y1 and the entirety of the lateral surfaces Y2 of the recess Y is covered by the reflective member 60, a sealing member 40 is not in contact with either the first portion 12 or the second portion 14. The sealing member 40 may not be in contact with the first portion 12 and the second portion 14, and may be connected via another member such as the light-reflective member 60.

Also with the method of manufacturing the light emitting device 4 according to the fourth embodiment, as in the method of manufacturing the light emitting device 1 according to the first embodiment, the recess Y housing the light emitting element 30 is formed after mounting of the light emitting element 30 on the plate-shaped base member 10, so that the light emitting element 30 can be mounted at a portion close to the lateral surfaces Y2 of the recess Y. Further, the step of bonding the first portion 12 and the second portion 14 with each other that includes arranging the light-reflective member 60 that covers at least a portion of the bottom surface Y1 and at least a portion of each of the lateral surfaces Y2 of the recess Y and filling the sealing member 40 into the recess Y allows the bonding strength between the first portion 12 and the second portion 14 to be further increased.

Further, with the method of manufacturing the light emitting device 4 according to the fourth embodiment, at least a portion of each of the lateral surfaces Y2 of the recess Y is covered by the light-reflecting member 60, so that light leakage from the lateral surfaces Y2 can be reduced. Accordingly, a width of the second portion 14 in a plan view can be reduced, so that a light emitting device 4 that allows miniaturization can be manufactured.

Further, with the method of manufacturing the light emitting device 4 according to the fourth embodiment, the light-reflective member 60 is disposed on the lateral surfaces Y2 of the recess Y after forming the recess Y, which allows reflectance at the vicinity of the light emitting element 30 to be further increased. Accordingly, with the method of manufacturing the light emitting device 4 according to the fourth embodiment, the light emitting device 4 having better light extraction efficiency can be obtained.

The light-reflective member 60 is made of a material that can reflect light emitted from the light emitting element 30. More specifically, the light-reflective member 60 is preferably made of a resin member containing a light-reflective substance. This is because a resin member can be easily handled and processed. Examples of the resin include a resin containing one or more of a silicone resin, a modified silicone resin, an epoxy resin, a modified epoxy resin, and an acrylic resin, or a hybrid resin which contains two or more of these. Examples of the light-reflective substance include titanium oxide, silicon oxide, zirconium oxide, potassium titanate, alumina, aluminum nitride, boron nitride, mullite, and glass filler.

The light-reflective member 60 can be disposed, after forming the recess Y, by a known method such as printing, spraying, or potting. Among these, a potting method is preferably employed. As described above, the gap between the first portion 12 and the second portion 14 can be filled by a caulking agent or a sealing agent, and such a caulking agent or a sealing agent may contain the light-reflective substance to serve as the light-reflective member 60. Further, as in the present embodiment, the light-reflective member 60 can be disposed in addition to the caulking agent or the sealing agent.

Light Emitting Device 1-4 According to First to Fourth Embodiment

Next, light emitting devices 1 to 4 according to the first to fourth embodiments will be described. The light emitting devices 1 to 4 can be efficiently manufactured by the method of manufacturing the light emitting device according to the first to fourth embodiments, respectively, but may also be manufactured by another method of manufacturing.

First, the light emitting devices 1 and 2 according to the first and second embodiments, respectively, will be described. Each of the light emitting devices 1 and 2 includes the base member 10 and at least one light emitting element 30. The base member 10 includes the first portion 12 and the second portion 14 having the through-hole X with a size that allows the first portion to fit within. That is, in a plan view, the second portion 14 has the through-hole X of a size as large as or a little larger than the area of the first portion 12. The first portion 12 has a substantially pillar shape, and has the upper surface, a lower surface in parallel with the upper surface, and lateral surfaces connected to the upper surface and the lower surface and substantially perpendicular to the lower surface. In the present embodiment, each of the upper surface and the lower surface of the first portion 12 has a substantially rectangular shape having rounded corners, but may have a substantially circular shape, a substantially ellipse shape, a substantially polygonal shape, or the like.

The base member 10 has a recess Y defined by the bottom surface Y1 and the lateral surfaces Y2. The upper surface of the first portion 12 serves as the bottom surface of the recess Y, and at least a portion of each of the inner lateral surfaces of the second portion 14 (more specifically, at least a portion of each of lateral surfaces of the through-hole X) serves as each of lateral surfaces Y2 of the recess Y. The lateral surfaces Y2 of the recess Y (i.e., the inner lateral surfaces of the second portion 14) are substantially perpendicular with respect to the bottom surface Y1 (i.e., the upper surface of the first portion 12). The light emitting element 30 is mounted on the upper surface of the first portion 12 (i.e., the bottom surface Y1 of the recess Y). The light emitting devices 1 and 2 each have a structure that allows miniaturization of the light emitting device 1, 2. Accordingly, with the structure of each of the light emitting devices 1 and 2, the light emitting device can be miniaturized, so that reduction in weight of the light emitting device can be achieved.

Figure 3G:
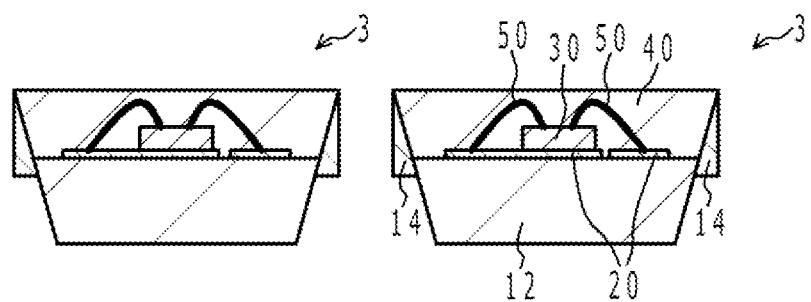
FIG. 3G is a schematic cross-sectional view illustrating a step of cutting a second portion in the method of manufacturing according to the third embodiment.

Next, a light emitting device 3 according to the third embodiment will be described. As shown in FIG. 3G the light emitting device 3 is different from the light emitting device 1, 2 according to the first and the second embodiments in that the lateral surfaces Y2 of the recess Y are inclined. Also in the light emitting device 3 according to the third embodiment, the first portion 12 is fitted with the through-hole X of the second portion 14. That is, in a plan view, the second portion 14 has the through-hole X as large as or a little larger than the area of the first portion 12. The first portion 12 has a substantially frustum shape in which an area of a lower surface thereof is smaller than an area of an upper surface thereof. That is, in a plan view, an outer periphery of the first portion 12 is located at an outer side of an outer periphery of the lower surface of the first portion 12. The first portion 12 has an upper surface, a lower surface substantially in parallel with the upper surface, and lateral surfaces connected to the upper surface and the lower surface. In the present embodiment, each of the upper surface and the lower surface of the first portion 12 has a substantially rectangular shape having rounded corners, but may have a substantially circular shape, a substantially ellipse shape, a substantially polygonal shape, or the like.

The base member 10 has the recess Y defined by the bottom surface Y1 and the lateral surfaces Y2. The upper surface of the first portion 12 serves as the bottom surface of the recess Y, and at least a portion of each of the inner lateral surfaces of the second portion 14 (more specifically, at least a portion of each of lateral surfaces of the through-hole X) serves as each of lateral surfaces Y2 of the recess Y. The lateral surfaces Y2 of the recess Y is inclined such that the recess widens from the bottom surface Y1 to an opening of the recess Y.

In the present embodiment, a shape of the upper surface of the first portion 12 and a plan view shape of the through-hole X at a lower surface side of the second portion 14 are substantially similar shapes, and the upper surface of the first portion 12 has an area greater than an area of the plan view shape of the through-hole X at the lower surface side of the second portion 14. That is, even without bonding the first portion 12 and the second portion 14 with each other via an adhesive member, the first portion 12 can be prevented from being detached from the through-hole X. Accordingly, the bonding strength between the first portion 12 and the second portion 14 can be increased, so that the light emitting device 3 having better mechanical strength can be obtained.

The light emitting device 3 has a structure that allows miniaturization of the light emitting device 3. Accordingly, with the structure of the light emitting device 3, the light emitting device can be miniaturized, so that reduction in weight of the light emitting device can be achieved. Further, in the light emitting device 3, with the lateral surfaces Y2 of the recess Y is inclined widening upward, light emitted from the light emitting element 30 is reflected by the lateral surfaces Y2, so that light extraction efficiency can be increased. Even further, the light emitting device 3 having an emission area greater than an area of the bottom surface of the light emitting device 3 can be obtained.

Figure 4G:
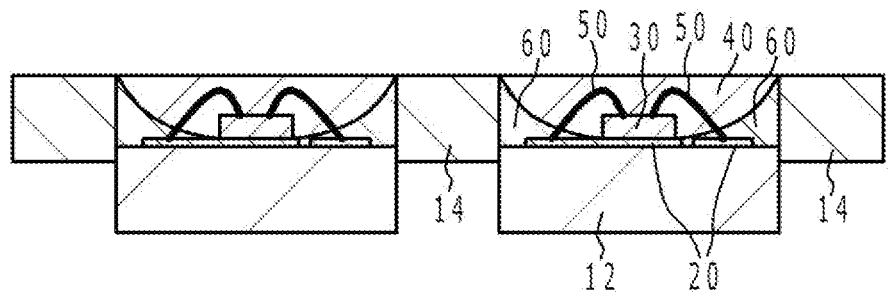
FIG. 4G is a schematic cross-sectional view taken along a line 4G-4G in FIG. 4F.
Figure 4H:
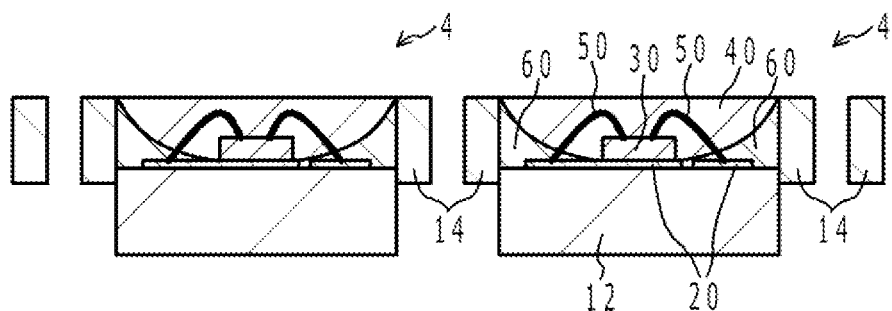
FIG. 4H is a schematic cross-sectional view illustrating a step of cutting the second portion in the method of manufacturing according to the fourth embodiment.

Next, a light emitting device 4 according to the fourth embodiment will be described. As shown in FIG. 4G, the light emitting device 4 is different from the light emitting device 1, 2 according to the first and the second embodiments, respectively, in that the light emitting device 4 includes a light-reflective member 60 covering at least a portion of each of the inner lateral surfaces Y2 defining the recess Y. In the present embodiment, the light-reflective member 60 also serves as a bonding member bonding the first portion 12 and the second portion 14. The light emitting device 4 has a structure that allows miniaturization of the light emitting device 4. Accordingly, with the structure of the light emitting device 4, the light emitting device can be miniaturized, so that reduction in weight of the light emitting device can be achieved. Further, with the light-reflective member continuously covers the bottom surface Y1 and the lateral surfaces Y2, bonding strength between the first portion 12 and the second portion 14 can be increased, so that the light emitting device 4 having better mechanical strength can be obtained.

In any one of the light emitting devices 1 to 4 according to the first to fourth embodiments, respectively, the sealing member 40 is preferably filled in the recess Y covering the light emitting element 30. With this arrangement, the first portion 12 and the second portion 14 can be firmly bonded with each other by the sealing member 40. The base member 10 preferably contains a light-reflective substance. With this arrangement, light reflectance in the recess Y can be increased, so that a light emitting device having good light extraction efficiency can be obtained. Further, the light emitting devices 1 to 4 may respectively include one or more wires for connecting between the light emitting element 30 and the base member 10 (more specifically, the conductive pads on the base member 10).

Certain embodiments are illustrated in the description above, and the description is not intended to limit the scope of the present invention thereto.

As described above, it should be obvious that various other embodiments are possible without departing the spirit and scope of the present invention. Accordingly, the scope and spirit of the present invention should be limited only by the following claims.

What is claimed is:

1. A light emitting device comprising:
   a base member including:
      a first portion including an upper surface on which a pair of conductive pads are disposed,
      a second portion including inner lateral surfaces of a thorough-hole having a size that allows the first portion to be fitted in the through-hole, and
      a recess defined by:
         the upper surface of the first portion that serves as a bottom surface of the recess, and
         at least portions of the inner lateral surfaces of the through-hole of the second portion that serve as lateral surfaces of the recess; and
   a light emitting element mounted on one of the pair of conductive pads disposed on the upper surface of the first portion that serves as the bottom surface of the recess, the light emitting element being electrically connected to both of the pair of conductive pads by respective wires,
   wherein a lower surface of the second portion is located closer to a light emitting surface side of the light emitting device than a lower surface of the first portion,
   a thickness of the first portion is substantially equal to a thickness of the second portion, and
   the first portion and the second portion are both made of the same insulating material.

2. The light emitting device according to claim 1, further comprising a sealing member covering the light emitting element in the recess.

3. The light emitting device according to claim 1, wherein the base member contains a light-reflective substance.

4. The light emitting device according to claim 2, wherein the base member contains a light-reflective substance.

5. The light emitting device according to claim 1, wherein the base member further includes another first portion including an upper surface on which a third conductive pad is disposed,
   the second portion further includes inner lateral surfaces of a second through-hole having a size that allows the another first portion to be fitted in the second through-hole, and
   the base member includes a second recess defined by:
      the upper surface of the another first portion that serves as the bottom surface of the second recess; and
      at least portions of the inner lateral surfaces of the second through-hole of the second portion that serve as lateral surfaces of the second recess, and
   the light emitting device comprises a second light emitting element mounted on the third conductive pad of the upper surface of the another first portion that serves as the bottom surface of the second recess.

6. The light emitting device according to claim 1, wherein according to a cross-section view of the recess, the lateral surfaces of the recess are substantially flat.

7. A light emitting device comprising:
   a base member including:
      a first portion including an upper surface on which a pair of conductive pads are disposed,
      a second portion including inner lateral surfaces of a thorough-hole having a size that allows the first portion to be fitted in the through-hole,
      a recess defined by:
         the upper surface of the first portion that serves as a bottom surface of the recess, and
         at least portions of the inner lateral surfaces of the through-hole of the second portion that serve as lateral surfaces of the recess; and
   a light emitting element mounted on one of the pair of conductive pads disposed on the upper surface of the first portion that serves as the bottom surface of recess, the light emitting element being electrically connected to both of the pair of conductive pads by respective wires,
   wherein the lateral surfaces of the recess are inclined,
   a lower surface of the second portion is located closer to a light emitting surface side of the light emitting device than a lower surface of the first portion,
   a thickness of the first portion is substantially equal to a thickness of the second portion, and
   the first portion and second portion are both made of the same insulating material.

8. The light emitting device according to claim 7, further comprising a sealing member covering the light emitting element in the recess.

9. The light emitting device according to claim 7, wherein the base member contains a light-reflective substance.

10. The light emitting device according to claim 8, wherein the base member contains a light-reflective substance.

11. The light emitting device according to claim 7, wherein
   the base member further includes another first portion including an upper surface on which a third conductive pad is disposed,
   the second portion further includes inner lateral surfaces of a second through-hole having a size that allows the another first portion to be fitted in the second through-hole, and
   the base member includes a second recess defined by:
      the upper surface of the another first portion that serves as the bottom surface of the second recess; and
      at least portions of the inner lateral surfaces of the second through-hole of the second portion that serves as lateral surfaces of the second recess, and
   the light emitting device comprises a second light emitting element mounted on the third conductive pad of the upper surface of the another first portion that serves as the bottom surface of the second recess.

12. A light emitting device comprising:
a base member including:
- a first portion including an upper surface on which a pair of conductive pads are disposed,
- a second portion including inner lateral surfaces of a thorough-hole having a size that allows the first portion to be fitted in the through-hole,
- a recess defined by:
  - the upper surface of the first portion that serves as a bottom surface of the recess, and
  - at least portions of the inner lateral surfaces of the through-hole of the second portion that serve as lateral surfaces of the recess; and
a light emitting element mounted on one of the conductive pads disposed on the upper surface of the first portion that serves as the bottom surface of the recess, the light emitting element being electrically connected to both of the pair of conductive pads by respective wires,
wherein the light emitting device further comprises a light reflective member covering at least a portion of each of the lateral surfaces of the recess,
a lower surface of the second portion is located closer to a light emitting surface side of the light emitting device than a lower surface of the first portion,
a thickness of the first portion is substantially equal to a thickness of the second portion, and
the first portion and second portion are both made of the same insulating material.

13. The light emitting device according to claim 12, further comprising a sealing member covering the light emitting element in the recess.

14. The light emitting device according to claim 12, wherein the base member contains a light-reflective substance.

15. The light emitting device according to claim 13, wherein the base member contains a light-reflective substance.

16. The light emitting device according to claim 12, wherein
- the base member further includes another first portion including an upper surface on which a third conductive pad is disposed,
- the second portion further includes inner lateral surfaces of a second through-hole having a size that allows the another first portion to be fitted in the second through-hole, and
- the base member includes a second recess defined by:
  - the upper surface of the another first portion that serves as the bottom surface of the second recess; and
  - at least portions of the inner lateral surfaces of the second through-hole of the second portion that serves as lateral surfaces of the second recess, and
- the light emitting device comprises a second light emitting element mounted on the third conductive pad of the upper surface of the another first portion that serves as the bottom surface of the second recess.

* * * * *